US006690556B2

United States Patent
Smola et al.

(10) Patent No.: US 6,690,556 B2
(45) Date of Patent: Feb. 10, 2004

(54) INTEGRATED CIRCUIT

(75) Inventors: Michael Smola, München (DE); Dominik Wegertseder, Haar (DE)

(73) Assignee: Infineon Technologies AG, Munich (DE)

(*) Notice: Subject to any disclaimer, the term of this patent is extended or adjusted under 35 U.S.C. 154(b) by 76 days.

(21) Appl. No.: 09/918,893

(22) Filed: Jul. 30, 2001

(65) Prior Publication Data

US 2002/0008428 A1 Jan. 24, 2002

Related U.S. Application Data

(63) Continuation of application No. PCT/EP00/00025, filed on Jan. 3, 2000.

(30) Foreign Application Priority Data

Jan. 29, 1999 (EP) .............................. 99101576

(51) Int. Cl.[7] .................................. H02H 9/00
(52) U.S. Cl. ........................... 361/56; 235/492
(58) Field of Search ................ 361/56, 91, 111; 235/492

(56) References Cited

U.S. PATENT DOCUMENTS

| 5,060,261 A | 10/1991 | Avenier et al. | |
|---|---|---|---|
| 5,159,629 A | * 10/1992 | Double et al. | 713/194 |
| 5,233,505 A | 8/1993 | Chang et al. | |
| 5,444,222 A | * 8/1995 | Inoue | 235/380 |
| 6,342,844 B1 | * 1/2002 | Rozin | 340/933 |

FOREIGN PATENT DOCUMENTS

DE          40 18 688 A1       1/1991

* cited by examiner

Primary Examiner—Gregory J. Toatley, Jr.
Assistant Examiner—James A Demakis
(74) Attorney, Agent, or Firm—Laurence A. Greenberg; Werner H. Stemer; Ralph E. Locher

(57) ABSTRACT

An integrated circuit with at least one antenna for the contactless transmission of data or energy. The antenna is configured above and/or below circuit sections to be protected and, as part of a protective circuit, enables the integrated circuit to be monitored with regard to an undesirable external attack. Such an attack can be identified by the attempt to effect observation or manipulation from the outside, which are typically associated with an alteration of the physical properties of the antenna. These physical alterations lead to significant changes in the protective circuit signals that are transmitted via the antenna. These changes are identified by signal detectors and initiate a transfer of the integrated circuit into a security mode. In this case, in addition to the function as means for transmitting data and/or energy, the antenna also serves the function of being a protective shield of a protective circuit for the integrated circuit. This integrated function of the antenna makes it possible to provide a cost-effective, protected integrated circuit with an antenna for contactless transmission in particular for use in smart cards.

10 Claims, 2 Drawing Sheets

INTEGRATED CIRCUIT

CROSS-REFERENCE TO RELATED APPLICATION

This application is a continuation of copending International Application No. PCT/EP00/00025, filed Jan. 3, 2000, which designated the United States.

BACKGROUND OF THE INVENTION

Field of the Invention

Smart cards are known which have an integrated circuit and which are provided with an antenna fitted on the smart card. Contactless transmission of data or energy to the integrated circuit of the smart card is possible by means of this antenna. In this case, the antenna is designed as a secondary coil of a transformer, as a result of which, when the smart card is in sufficient proximity to a primary coil in a terminal, a voltage can be generated in the antenna and the integrated circuit can thereby be supplied with energy. In addition, data can be transmitted into or out of the smart card to the external primary coil in the terminal. These smart cards prove to be highly susceptible to third-party analyses or else to manipulations. Moreover, they are highly susceptible to mechanical loading and are expensive.

Electronic circuits are known which contain security-relevant information and are protected against third-party analysis or else against manipulation by special protective circuits. Various methods have been described for achieving such protection. By way of example, integrated circuits to be protected are provided with a metallic casing made, for example, of silver or titanium, thereby making it possible to prevent the integrated circuit from being read by means of X-rays. Furthermore, it has proved successful to configure an interconnect as a protective shield line in the topmost circuit plane of an integrated circuit and to monitor its physical properties, such as the resistance, the capacitance, etc. When an alteration is ascertained, for example, as a result of short-circuiting, grounding or severing in the event of undesirable observation or manipulation, an alarm signal is triggered. On the basis of this alarm signal, the integrated circuit is transferred into a state referred to as the security mode. In this security mode, by way of example, the contents of the memory cells can no longer be read out, since, by way of example, immediately after the transition to the security mode, they are completely erased and, consequently, the information contained therein is irretrievably lost. As a result, it is no longer possible to read out or manipulate the important information of the integrated circuit, for example code keys or PIN numbers or personal data of the user, which is contained in the program and data memories. Protective circuits of this type prove to be very complicated in terms of circuitry and are very expensive, since they necessitate appreciably enlarged chip areas.

SUMMARY OF THE INVENTION

It is accordingly an object of the invention to provide an integrated circuit having an antenna for the contactless transmission of data or energy which overcomes the above-mentioned disadvantageous of the prior art apparatus of this general type.

With the foregoing and other objects in view there is provided, in accordance with the invention, an integrated circuit having at least one antenna for contactless transmission of data or energy. The integrated circuit includes a plurality of circuit planes configured one above another, and a plurality of circuit sections that are to be protected. The plurality of the circuit sections are located in the plurality of the circuit planes. The integrated circuit also includes at least one antenna for contactless transmission of a signal selected from the group consisting of a data signal and an energy signal. The antenna is configured at a location selected from the group consisting of a location that is above the plurality of the circuit sections and a location that is below the plurality of the circuit sections. The integrated circuit also includes a protective circuit that monitors the plurality of the circuit sections with regard to an attack. The protective circuit is connected to the antenna.

The invention exhibits an integrated circuit whose antenna, for the contactless transmission of data or energy, is realized as part of the integrated circuit and, consequently, is formed in the context of the integrated circuit fabrication process. As a result, it is possible to dispense with a multiplicity of electrical contacts between the antenna and the receiver circuit and, moreover, to reduce the length of the transmission paths from the antenna to the receiver circuit and also to the antenna, which appreciably reduces the losses of signal strength on the transmission path. This makes it possible for the antenna or the receiver for the transmitted signal or the transmitter for the signal to be transmitted to be made simpler and smaller in terms of die size, which makes the integrated circuit more cost-effective. In prior art devices, electrical connecting lines running between an external antenna and an integrated circuit can break due to a flexure of the smart card. However, the inventive integrated circuit with the antenna proves to be less susceptible to mechanical loading caused by flexure of the smart card, since mechanical damage to such connecting lines or to the antenna as is the case in the prior art is now precluded. As a result, the integrated circuit with the antenna according to the invention proves to be less susceptible.

In accordance with an added feature of the invention, the antenna that is integrated in the circuit is not only used as a transmitting or receiving antenna, but furthermore, is also used as a protective shield that is configured above and/or below the circuit sections of the integrated circuit which are to be protected. This is achieved by configuring the antenna in a circuit plane configured above and/or below the circuit plane for the circuit to be protected or the circuit sections to be protected. Protective circuit signals are applied to the antenna, as part of the protective circuit. These signals are transmitted via the interconnect/s of the antenna and are subsequently examined. If significant deviations are ascertained in the context of the examination, then an alarm signal is triggered which transfers the integrated circuit to a security mode. These deviations can be caused by the interconnects of the antenna being short-circuited, interrupted, or altered in their physical properties, for example resistance, capacitance or the like, in such a way that this alteration is identified as an intervention, for example, by mechanical removal of individual layers of the integrated circuit, or by drilling through the protective shield, or by making contact with the interconnects of the antenna.

This multiple function of the antenna as transmitting and receiving element for the transmission of data or energy and also as a protective shield of the protective circuit makes it possible, in turn, to further reduce the chip area required for the realization of the protected, integrated circuit with an antenna, since integrative utilization of the antenna is provided. Furthermore, the required supply lines and outgoing lines of the antenna and of the protective circuit and also the precautions thereof for decoupling the lines can be simplified or reduced.

In this case, the protective shield can be realized both by a single antenna and by a plurality of mutually separate antennas. Such a multiple design of the antennas makes it possible not only to transmit differentiated signals but also to detect, in a spatially differentiated manner depending on the position of the individual antennas, an attack on a specific circuit section to be protected, and thereby to implement, in a targeted manner, differentiated measures for protecting the relevant circuit section or else circuit sections going beyond that.

In accordance with an additional feature of the invention, there is provided, one or more selection elements which are assigned to the antenna and define the function of the antenna as part of the protective circuit or as means for transmitting data or energy. This functional assignment can be effected in such a way that either the protection function or the transmission function is present at one point in time, while the other functionality is provided at another, later point in time. These two functions are defined in an alternating manner by means of the selection elements. This alternating definition can ensue in a fixed, in particular uniform, time frame, which significantly facilitates the signal evaluation of the protective circuit signals. The functional assignment of the antenna is effected in the manner of time division multiplex operation.

In accordance with another feature of the invention, it is also possible to apply to the antenna, a signal which, on the one hand, enables the transmission of the data that are to be transmitted by the integrated circuit, and, on the other hand, is suitable for being used as a protective circuit signal. Such a signal is routinely suitable for such an application when it contains protective circuit signals and transmission and/or reception signals which can be separated from one another. The separation or the combination is performed by the selection means, which, in the case of separation, can be designed for example as a frequency filter with a high-pass or a low-pass filter characteristic or a bandpass filter characteristic or as demodulator. In the case of superposed signals of different frequencies, the separation can be performed through a suitable choice of filters. Correspondingly, it is also possible for a suitable demodulator to be used such that a second signal modulated onto a signal is extracted and evaluated separately from the first signal. In this case, the united, common signal is jointly transmitted via the interconnects of the antenna. In this case, the antenna is thus used simultaneously as transmission means for data and/or energy and also as part of the protective circuit for the integrated circuit. This simultaneous functionality ensures that a detection of an attack on the integrated circuit with the protected circuit sections is identified at any arbitrary point in time.

In accordance with a further feature of the invention, the antenna and thus the interconnects of the antenna are designed in such a way that they mostly, ideally completely, areally cover the protected integrated circuit or the circuit sections thereof in such a way that in an inspection through the antenna to the protected circuit sections, it is no longer possible to directly reach the protected circuit for example through holes or the like, in other words, without harming the interconnects of the antenna. This extensive or complete coverage is made possible, in a simple and reliable manner, in particular by forming the interconnects over a plurality of circuit planes or in a plurality of circuit planes, since the interconnects in one plane must be configured at a sufficient distance from one another in order to thereby prevent crosstalk. The region between the interconnects of the antenna in one circuit plane can be precisely covered by interconnects in other circuit planes, with the result that the circuit sections to be protected can be completely covered. The antenna is preferably designed with interconnects having a very small interconnect width which corresponds to, or is smaller than, the size of a hole for attacking the protected circuit. Thus, each hole leads to an interruption of the interconnect, and consequently, to a fault signal that can be detected very reliably. Moreover, it is possible for such a hole to lead to a short circuit between different interconnects, which, as a total signal collapse, is identified very reliably as a fault signal by the corresponding detectors. The design of the interconnects of the antenna as very narrow interconnects whose widths preferably correspond to the minimum interconnect width in a specific chip technology that is used makes it possible to realize a coil-type antenna with a very large number of turns. This high number of turns makes it possible to transmit considerable energies with the antenna. Consequently, the preferred design of an antenna with a very large number of turns proves to be particularly suitable for a protective circuit with particularly fine interconnects which are closely spaced with respect to one another.

In accordance with a further added feature of the invention, the circuit section(s) of the integrated circuit that are to be protected are enclosed by a plurality of antennas in a sandwich-like manner, thereby precluding observation or manipulation of the circuit sections configured between the antennas, both from above and from below. In this case, it has proved successful for the antenna to be designed preferably in a whole-area manner in the respective topmost and/or bottommost circuit plane of the integrated circuit. As a result, optimal transmission of data or of energy is made possible, since a shielding effect is provided solely by the housing of the integrated circuit and not by other planes of the integrated circuit, and in addition optimal protection of the inner circuit planes of the integrated circuit is achieved, since now these inner circuit planes are completely covered, and are thereby protected, by the topmost and bottommost circuit plane which have the antennas configured therein. Consequently, a successful attack can only be effected via the side of the integrated circuit with the different circuit planes.

In accordance with a further additional feature of the invention, the antenna or the antennas in a circuit plane are of helical design, which makes it possible to produce a multiplicity of turns for the antenna or the antennas in a particularly simple manner in terms of production engineering. These antennas of helical design can act as a secondary coil of a transformer whose primary coil is situated in a terminal which is suitable for the evaluation and transmission of data of a smart card with the inventive integrated circuit. This transmission of data and energy between the primary and secondary coils, and vice versa, is effected as in the case of a conventional transformer, in which an alternating voltage signal is transmitted from one coil to the other coil, and in the process, not only are the varying signals transmitted but also energy is additionally transmitted from one coil to the other coil.

In accordance with yet a further added feature of the invention, the signal generators for generating a protective circuit signal and/or the signal detectors for evaluating the protective circuit signal fed from the antenna are configured in a circuit plane below the topmost circuit plane with the antenna and are protected by the interconnects thereof against an access that is to be prevented. Equally, the signal detectors and/or the signal generators are configured in a circuit plane above the bottommost circuit plane with interconnects of the antenna, thereby producing a sandwich-like structure which protects the signal detectors and/or the signal generators of the protective circuit by means of the antennas in the outermost circuit planes of the integrated circuit and which furthermore affords protection for the further circuit sections of the integrated circuit that are to be protected. This systematic construction provides cascading protection by means of the interconnects of the antenna or of the antennas for the signal generators and/or the signal detectors and by means of the interconnect of the antenna with the signal generators and the signal detectors for the rest of the integrated circuit. This configuration prevents observation or manipulation of the signal generators or signal detectors because of the protection by means of the overlying interconnects of the antenna or of the antennas, which precludes a further possibility of attack in which signals are fed directly without a detour via the interconnects into the signal detectors. Consequently, a configuration of this type proves to be a particularly suitable means for increasing the protective action of the protective circuit with the assigned antenna for the integrated circuit.

It has proved successful to design the signal detectors in such a way that the transmitted protective circuit signals are examined with regard to their integrity during evaluation, and this can be done, in particular, by means of a CRC check, by means of a checksum comparison, by means of a parity check or by means of signature comparison, in particular in the case of digital protective circuit signals. This integrity comparison between the protective circuit signal transmitted via the antenna and the integrity value of the expected signal—also called the reference signal— makes it possible to preclude a manipulation of the protective circuit with a straightforward identity comparison for ascertaining an incorrect behavior, in which the signal detector is virtually short-circuited and is fed one and the same signal both as the reference signal and as the signal transmitted via the antenna, in contrast to a protective circuit.

Other features which are considered as characteristic for the invention are set forth in the appended claims.

Although the invention is illustrated and described herein as embodied in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
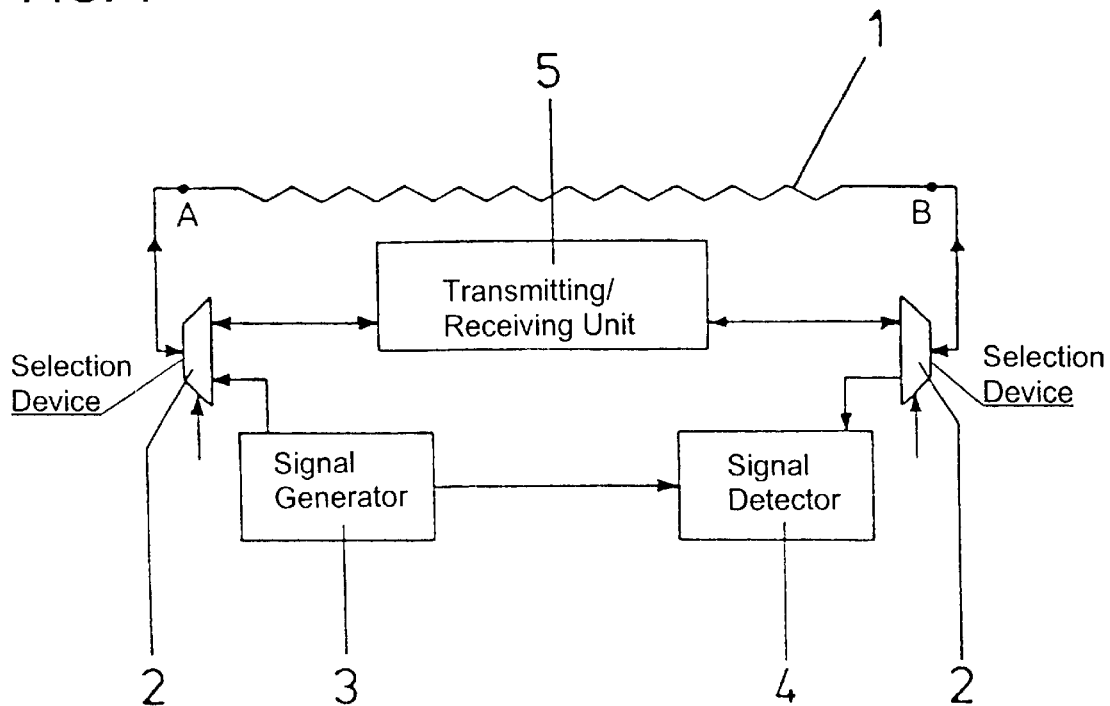
FIG. 1 shows the circuit construction of an exemplary embodiment of an integrated circuit.

Referring now to the figures of the drawing in detail and first, particularly, to FIG. 1 thereof, there is diagrammatically shown a construction of an integrated circuit. Circuit sections which do not contribute to the functionality of the invention have not been illustrated.

The invention includes an antenna 1 extending from point A up to point B. The antenna 1 is assigned a transmitting/receiving unit 5 for the transmission of data and energy. This transmission is effected as contactless transmission by means of the antenna 1. If data are intended to be transmitted from the integrated circuit to an external receiver, then these data are generated in the transmitting/receiving unit 5 and fed to the antenna 1 via point A of the antenna 1. The antenna 1 emits the signal that has been fed in and this signal is received as electromagnetic waves by an external antenna and a receiver assigned to the external antenna. The received signal is then evaluated and represented. If data are intended to be received by the integrated circuit, then the corresponding electromagnetic signals are taken up by the antenna 1 and converted into electrical signals which are fed to the transmitting/receiving unit 5 via point B of the antenna 1. Here the received signals are amplified, analyzed and made available to the further integrated circuits (not illustrated). In addition to data transmission by means of modulation of the received electromagnetic fields, it is also possible to feed energy to the integrated circuit via the antenna 1. This transmitted energy is used to operate the integrated circuit.

In addition to the data to be transmitted, protective circuit signals that are generated by a signal generator 3 are also applied to the antenna 1. These protective circuit signals are fed to the antenna 1 via point A in accordance with the data to be transmitted and are transmitted via the interconnect of the antenna 1 to point B, from where the protective circuit signals are fed to a signal detector 4. Each protective circuit signal fed in is compared with a reference signal which is fed from the signal detector 3 without a detour via the antenna 1 to the signal detector 4. The reference signal either directly represents the signal as it is expected to be after traversing the antenna 1, or it contains the necessary information in order to ascertain that the protective circuit signal, which has been transmitted via the antenna 1, has been altered as a result of an unauthorized attack. Such information may be formed by integrity criteria in the form of checksums or suchlike. If a significant difference between the reference signal and the signal that has been received by the antenna 1 is ascertained in the signal detector 4, then an alarm signal is generated which, used as a control signal, transfers the integrated circuit to a security mode. In this security mode, by way of example, the contents of the memory cell can no longer be read out, since they are completely erased preferably immediately after the transition to the security mode, and consequently, the information contained therein has been irretrievably lost. Thus, it is no longer possible to read out or to manipulate the important information, for example code keys or PIN numbers or personal data of the user, which is contained in the program and data memories of the integrated circuit.

Such alteration of the protective circuit signal on the transmission path of the antenna 1 is brought about when the integrated circuit is externally manipulated or observed, for example, by shaving off the covering surfaces layer by layer, by drilling into the circuit planes, or by applying contact pins. These interventions used in the integrated circuit, in which the antenna 1 is used as part of the protective circuit which covers the circuit sections to be protected and reacts to attacks by providing an altered signal, effectively prevents an attack on the protected circuit sections. The significant alterations of the protective circuit signals are effected by altering the physical properties of the antenna 1, which are brought about in particular by short circuit, by interruption or by alteration of the resistance or of the capacitance.

Consequently, the antenna 1 has two mutually separate functionalities. On the one hand, it acts as means for the contactless transmission of data or energy and, on the other hand, it acts as part of a protective circuit which monitors parts of the integrated circuit with regard to undesirable attacks. These two functions are realized in an alternating fashion in the manner of time division multiplex operation. For this purpose, respective selection devices or selection means 2 are provided which, on one side, are connected to the transmitting/receiving unit 5 and either to the signal generator 3 or the signal detector 4, respectively. The other sides of the respective selection means 2 are connected to point A or point B of the antenna 1, respectively. These selection means 2 are controlled by a control unit (not illustrated) in such a way that, depending on the mode of operation, they switch over between the transmitting/receiving unit 5 and the signal generator 3 or the signal detector 4, respectively. As a result, the antenna 1 of the integrated circuit can be operated as part of the protective circuit at one point in time that is defined by the control unit, while operation as an antenna for the contactless transmission of data or energy is possible at another defined point in time. Consequently, the antenna is operated with a different function depending on the circuit state of the selection means 2. As a result, it is possible to dispense with a multiple design of the antenna 1 first as means for transmitting data or energy and/or as a protective shield, which results in a reduced die size for the integrated circuit and thus in reduced costs for the integrated circuit.

Figure 2:
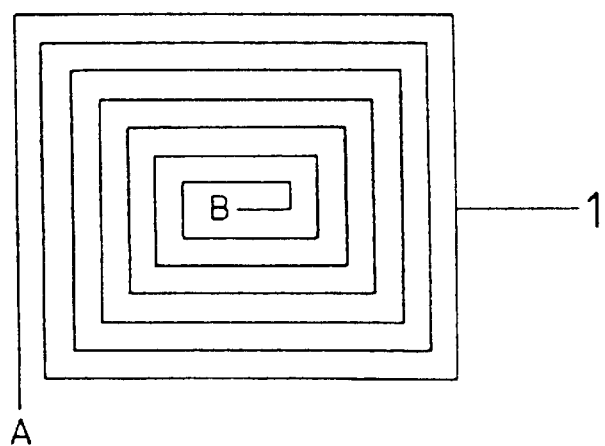
FIG. 2 shows a preferred antenna design in a circuit plane.

FIG. 2 illustrates a preferred design of the antenna 1 in a circuit plane of the integrated circuit. The antenna 1 illustrated is of helical design, thereby achieving a very dense interconnect structure which has the result that an attack in the region of the helical antenna 1 leads to a short circuit of adjacent interconnects or to the interruption of the interconnects, which leads to a distinctly altered transmitted protective circuit signal. This distinct change is then identified by means of the signal detector 4 in the manner described and the integrated circuit is transferred to the security mode.

The planar helical design of the antenna 1 ensures that the circuit sections of the integrated circuit, which are configured below the antenna 1 in underlying circuit planes and are thus covered by the antenna 1, can only be attacked by destruction or by intervention in the antenna 1 from above through this antenna 1. However, such an attack is identified by the antenna 1 in the function of the protective circuit and is handled accordingly. The antenna 1 is preferably configured in the topmost and in the bottommost circuit plane of the integrated circuit, thereby achieving, on the one hand, a comprehensive protection of the intervening circuit planes and, in addition, a markedly good transmission and/or reception characteristic thereof for transmitting data or energy. In order to achieve an optimized transmission and/or reception characteristic, the antenna is designed as a coil with the highest possible number of turns, as a result of which the energy that can be transmitted can be increased. Moreover, even small signal alterations, which represent the data to be transmitted, can be received and detected. The design with the antenna as a coil with as many turns as possible also ensures that the distances between the individual turns are chosen to be very small in relation to the limited total area of the circuit plane of the integrated circuit, with the result that the risk of an unnoticed attack on the integrated circuit by exact positioning of the point of attack between two interconnects can be significantly reduced.

Figure 3:
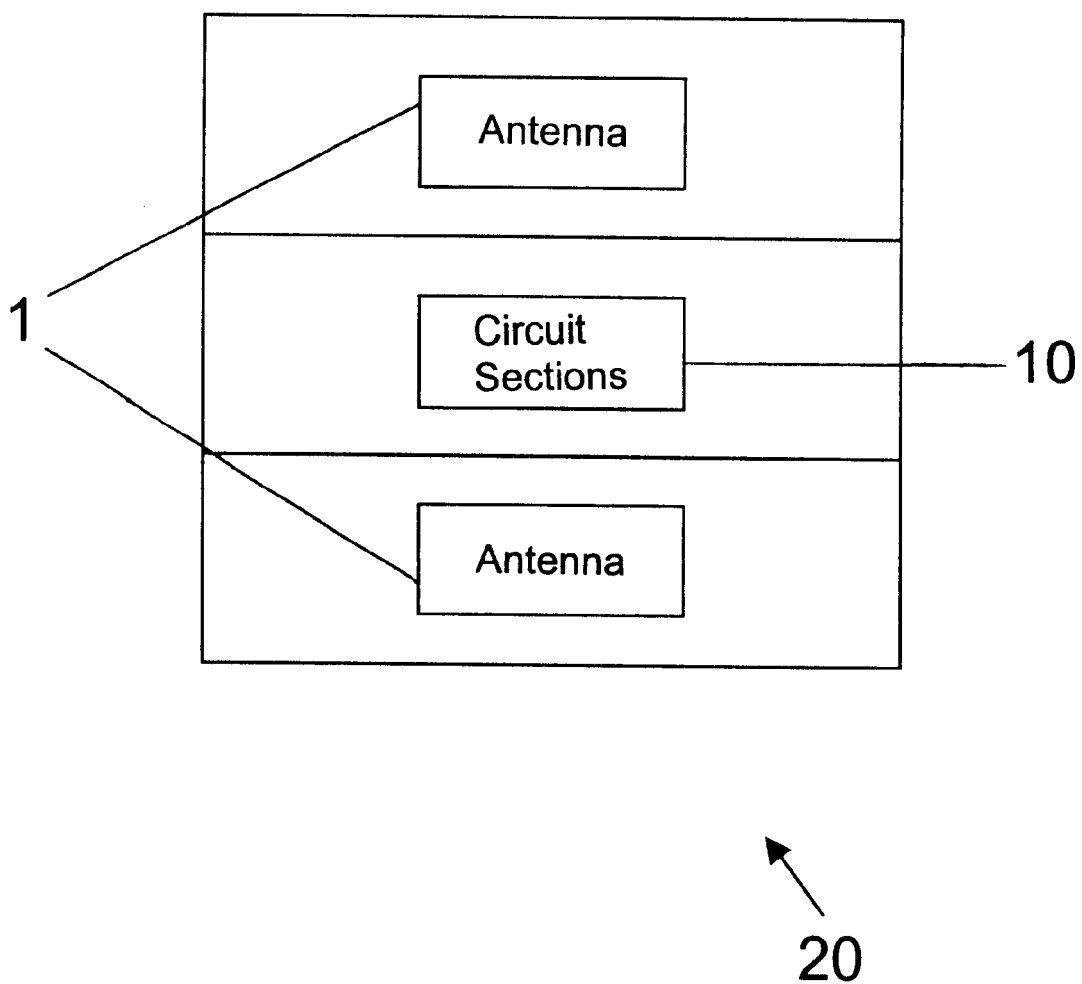
FIG. 3 is a block diagram showing a view of an exemplary embodiment of the integrated circuit.

FIG. 3 is a very simplified block diagram showing a plurality of circuit planes 20 that are configured one above the other. Circuit sections 10 can be located in one or more of the circuit planes 20. These circuit sections 10 include the electronic components shown in FIG. 1, such as the selection means 2, the signal generator 3, the signal detector 4, and the transmitting/receiving unit. Note that antennas 1 are shown in circuit planes 20 that are configured both above and below the circuit sections 10 in order to detect an attack from both above and below the circuit sections 10. The antenna 1 advantageously at least mostly covers the circuit sections 10 from above and below.

We claim:

1. An integrated circuit having at least one antenna for contactless transmission of data or energy and for monitoring the integrated circuit with regard to undesirable attacks, which comprises:

a plurality of circuit planes configured one above another;
a plurality of circuit sections to be protected, said plurality of said circuit sections located in said plurality of said circuit planes;
at least one antenna for contactless transmission of a signal selected from the group consisting of a data signal and an energy signal, said antenna configured at a location selected from the group consisting of a location that is above said plurality of said circuit sections and a location that is below said plurality of said circuit sections; and
a protective circuit that monitors said plurality of said circuit sections with regard to an attack, said protective circuit connected to said antenna;
said at least one antenna having mutually separate functions for contactless transmission of data or energy and as part of said protective circuit for monitoring said circuit sections against undesirable attacks.

2. The integrated circuit according to claim 1, wherein said protective circuit is switchably connected to said antenna.

3. The integrated circuit according to claim 1, comprising:
selection means assigned to said antenna for defining a function of said antenna;
said function selected from the group consisting of forming an operative part of said protective circuit and forming a means for the transmission of the signal selected from the group consisting of the data signal and the energy signal.

4. The integrated circuit according to claim 3, wherein said selection means is constructed to define the function of said antenna in a temporally alternating manner.

5. The integrated circuit according to claim 3, wherein:
said selection means is constructed for outputting signals to said antenna and for obtaining signals from said antenna that can be separated from each other; and
the signals obtained from said antenna include protective circuit signals and signals selected from the group consisting of transmission signals and reception signals.

6. The integrated circuit according to claim 5, wherein:
said selection means includes components for separating the protective circuit signals from the signals selected from the group consisting of the transmission signals and the reception signals; and
said components are selected from the group consisting of filters and demodulators.

7. The integrated circuit according to claim 1, wherein said antenna at least mostly covers said plurality of said circuit section.

8. The integrated circuit according to claim 1, wherein said at least one antenna at least mostly covers said plurality of said circuit sections from above and from below in a sandwich-like manner.

9. The integrated circuit according to claim 1, wherein said antenna is located in one of said plurality of said circuit planes and has a helical design.

10. The integrated circuit according to claim 1, comprising:

at least one signal generator for generating a protective circuit signal and for feeding the protective circuit signal to said antenna;

said protective circuit including a signal detector connected to said antenna for obtaining the protective circuit signal and for evaluating the protective circuit signal that is obtained from said antenna; and said antenna at least mostly covering said signal generator and said signal detector.

* * * * *